US007053649B1

(12) United States Patent
Osada

(10) Patent No.: US 7,053,649 B1
(45) Date of Patent: May 30, 2006

(54) IMAGE DISPLAY DEVICE AND METHOD OF TESTING THE SAME

(75) Inventor: Takeshi Osada, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 131 days.

(21) Appl. No.: 10/724,835

(22) Filed: Dec. 2, 2003

(30) Foreign Application Priority Data

Dec. 6, 2002 (JP) ............................ 2002-354804

(51) Int. Cl.
*G01R 31/00* (2006.01)

(52) U.S. Cl. ...................................... 324/767; 324/770

(58) Field of Classification Search ..................... None
See application file for complete search history.

(56) References Cited

U.S. PATENT DOCUMENTS 5,513,028 A 4/1996 Sono et al.
6,762,735 B1 * 7/2004 Koyama ...................... 345/76
6,809,482 B1 * 10/2004 Koyama .................. 315/169.3
6,909,409 B1 * 6/2005 Tanada ........................ 345/51
2001/0038367 A1 * 11/2001 Inukai ......................... 345/76
2001/0040565 A1 11/2001 Koyama
2002/0044124 A1 4/2002 Yamazaki et al.

FOREIGN PATENT DOCUMENTS

EP 0 558 058 A1 9/1993
EP 1 003 065 A2 5/2000
EP 1 022 603 A2 7/2000
EP 1 022 604 A2 7/2000
JP 05-241153 9/1993
JP 2618042 6/1997
JP 2002-116423 4/2002

* cited by examiner

*Primary Examiner*—Minh N. Tang
(74) *Attorney, Agent, or Firm*—Fish & Richardson P.C.

(57) ABSTRACT

It is the object of the present invention to provide a simple and accurate testing circuit and a testing method while occupying as small space as possible in an image display device. By partly changing dummy pixels arranged in the periphery of a display region into a testing circuit, tests for detecting broken wires in data signal lines and scanning lines and whether pixels are controlled adequately can be conducted easily and accurately, occupying as small space as possible without a need of an additional complicated circuit. Accordingly, a display panel can be produced at a low cost.

8 Claims, 7 Drawing Sheets

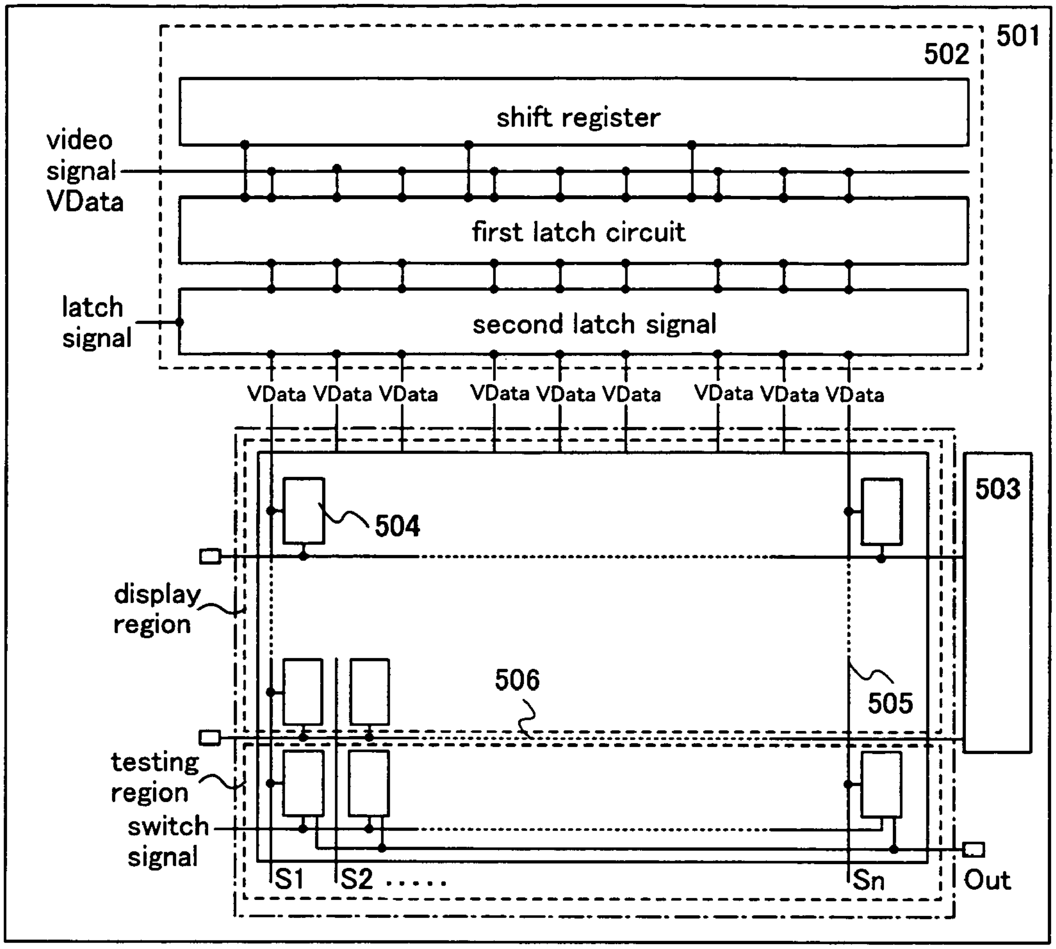
Fig. 5A
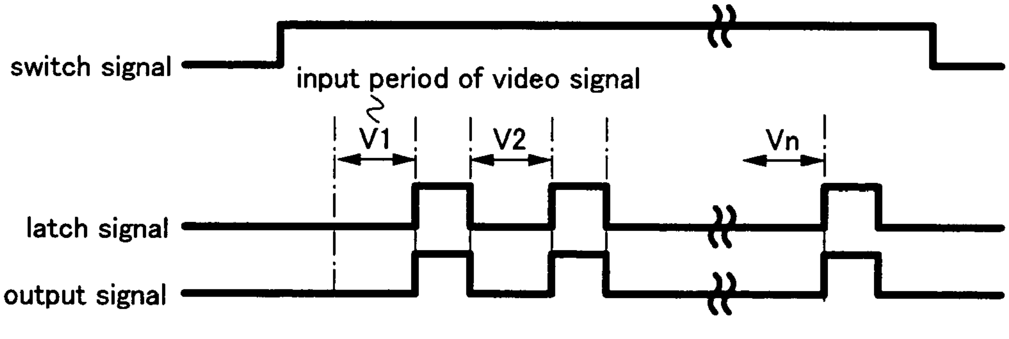
Fig. 5B
| VData | S1 | S2 | ··· | Sn |
|---|---|---|---|---|
| V1 | 1 | 0 | | 0 |
| V2 | 0 | 1 | | 0 |
| ⋮ | | | ⋱ | |
| Vn | 0 | 0 | | 1 |
Fig. 5C

IMAGE DISPLAY DEVICE AND METHOD OF TESTING THE SAME

BACKGROUND OF THE INVENTION

1. Field of the Invention

The present invention relates to an image display device in which a plurality of pixels are arranged in matrix and a method of testing the image display device.

2. Description of the Related Art

In recent years, image display devices such as a liquid crystal display (LCD), an electroluminescence (EL) display and the like have been advanced in precision and thus the degree of integration of elements has been remarkably improved as well.

It is an essential part of the production line of image display device to test if a circuit mounted on a substrate operates normally before shipment as a finished panel. The test process itself has been becoming more complicated in accordance with the higher precision.

FIG. 3 shows a configuration of a substrate on which a testing circuit is implemented in a conventional image display device. Such a configuration is shown, for example, in Japanese Patent Laid-Open No. 14-116423. The image display device comprises a substrate 301, a source driver circuit 302, a gate driver circuit 303, a pixel 304, a data signal line 305, a scanning line 306, a testing circuit 311, a switch driver circuit 312, an analog switch 313, a testing line 314, and testing terminals 315*a* and 315*b*. The substrate 301 mounts the testing circuit 311 and the pixel 304 which are arranged in matrix, and the data signal line (source bus line) 305 and the scanning line (gate bus line) 306 are arranged so as to be orthogonal to each other. The scanning line 306 is connected to the gate driver circuit 303 and the data signal line 305 is connected to the source driver circuit 302.

A pixel portion of the display device comprises a first pixel, which is provided in a display region and contribute to an image display and a second pixel, which is provided in outer edges of the display region (hereinafter referred to as a non-display region) and have no influence on the image display. FIG. 7A shows an overview thereof. The image display device comprises a substrate 701, a source driver circuit 702, a gate driver circuit 703, a pixel portion 704, a data signal line 707, and a scanning line 706. A non-display region 704*b* is provided at one side of outer edges of a display region 704*a* for simplicity, however, it is often the case that the non-display region 704*b* is provided so as to surround the outer edges of the display region 704*a*.

In the display device, each pixels connected to the scanning line 306 is controlled by the scanning line 306. A video signal is sequentially supplied to the source driver circuit 302 and the video signal is outputted simultaneously to the data signal line 305 when a latch signal is inputted, and afterwards inputted to each pixel.

The configuration of a pixel in the display device is explained in details with reference to FIG. 7B. Each of the first and second pixels comprises a data signal line 711, a scanning line 712, a current supply line 717, a switching thin film transistor 713 (thin film transistor is hereinafter referred to as TFT), a driver TFT 714, a capacitor 715, a light emitting element 716, and a power source line 718.

The switching TFT 713 is provided between a gate electrode of the driver TFT 714 and the data signal line 711, and the scanning line 712 is connected to a gate electrode of the switching TFT 713. Therefore, the driver TFT 714 can be controlled by a signal outputted to the data signal line 711 when the switching TFT 713 is ON. The capacitor 715 is provided between the gate electrode of the driver TFT 714 and the current supply line 717 and holds a voltage between gate and source of the driver TFT 714.

The difference between the first and second pixels is explained hereafter. In the first pixel, a light emitting element is provided between a driver TFT and a power source, a light is emitted when a current is supplied to the light emitting element by supplying a current from the current supply line through the driver TFT. The light emitting element emits a light according to the potential of video signals inputted from a source signal line to a gate electrode of the driver TFT. In the second pixel, a light emitting element is not connected to a driver TFT, hence the second pixel is a dummy pixel which does not emit light.

One reason why such a non-display region having a dummy pixel is provided in peripheral portions of a display region is that the peripheral portion of a pixel portion tends to be inhomogeneous compared with the center part thereof in the step for forming a liquid crystal element and a light emitting element in the pixel portion in a flat panel display such as a liquid crystal display device or a light emitting device. See, for example, Japanese Patent Laid-Open No. 5-241153.

A short circuit between wirings and broken wires of the display device can be detected by a method of testing an output by bringing a probe pin into contact with the detecting pad 315*a*, or by a method of using a testing circuit 311. The testing circuit 311 supplies a potential level of each data signal line to a testing line 314 sequentially while driving a switch control circuit 312, then a short circuit between wirings and broken wires of the display device can be detected by bringing a probe pin into contact with the testing terminal 315*b*.

The method of testing by bringing a probe pin into contact with the testing terminal 315*a* requires a lot of time since every testing terminal of every testing line has to be tested. Instead, when a number of probe pins is increased for saving time, expensive testing apparatus is required. As another idea, it is suggested that the testing circuit 311 is formed over a substrate, however, the testing circuit requires a large space since the switching driver circuit 312 is required in the testing circuit, although the testing circuit 311 has nothing to do with the image display.

An image display device having a testing circuit without a switching driver circuit is suggested (for example, U.S. Pat. No. 2,618,042). FIG. 4 is a configuration diagram of the image display device which comprises a substrate 401, a source driver circuit 402, a gate driver circuit 403, a pixel 404, a data signal line 405, a scanning line 406, a video signal line 407, analog switches 408 and 412, a testing circuit 411, a testing line 413, and testing terminals 414*a* and 414*b*. The data signal line 405 is connected to a gate of the analog switch 412.

Faults such as broken wires of the data signal lines 405 can be detected by inputting a testing pulse to the video signal line 407 and observing an output waveform from the analog switch 412 at a testing terminal 414*b*.

SUMMARY OF THE INVENTION

The above-mentioned testing method only tests the operations of the gate driver circuit 403 and the source driver circuit 402 and the qualities of the scanning lines 406 and data signal lines 405, therefore it is not sufficient unless the method can test whether a thin film transistors in a pixel 404 are controlled adequately.

It is an object of the invention to provide an image display device with the minimum testing area which can be tested easily in a short time without using many probe pins, and which can not only test a driver circuit, scanning lines, and data signal lines, but also test whether TFTs inside the pixels are controlled adequately. It is a further object of the invention to provide a method for testing the image display device.

The invention provides a testing circuit or a dummy circuit by changing a part of a pixel circuit in a display device so that circuits in pixels and whether pixels are controlled adequately are easily and accurately tested, while making the space for testing circuit as small as possible.

An image display device comprises a pixel portion comprising a display region and a testing region wherein the display region and the testing region comprise a first pixel circuit and a second pixel circuit, respectively. Each of the first and second pixel circuits comprises a data signal line, a scanning line, a driver transistor, and a switching transistor provided between the data signal line and a gate electrode of the driver transistor wherein a gate electrode of the switching transistor is electrically connected to the scanning line, the driver transistor of the first pixel circuit is provided between a current supply line and a light emitting element, and the driver transistor of the second pixel circuit is provided between the current supply line and a testing terminal.

An image display device comprises a pixel portion comprising a display region and a testing region, wherein the display region and the testing region comprises a first pixel circuit and a second pixel circuit, respectively. The first pixel circuit comprises a data signal line, a scanning line, a driver transistor provided between a current supply line and a light emitting element, and a switching transistor provided between the data signal line and a gate electrode of the driver transistor. The second pixel circuit comprises the data signal line, the scanning line, and the switching transistor provided between the data signal line and a testing output terminal wherein a gate electrode of the switching transistor of the first pixel circuit is electrically connected to the scanning line.

An image display device of the invention is characterized by providing the testing region in a dummy pixel region in the outer edge portion of the display region.

An image display device comprises a pixel portion comprising a display region and a testing region wherein the display region and the testing region comprise a first pixel circuit and a second pixel circuit, respectively. Each of the first and second pixel circuits comprises a data signal line, a scanning line, a driver transistor, and a switching transistor provided between the data signal line and a gate electrode of the driver transistor. A gate electrode of the switching transistor is electrically connected to the scanning line, the driver transistor of the first pixel circuit is provided between a current supply line and a light emitting element, the driver transistor of the second pixel circuit is provided between the current supply line and a testing terminal, and the scanning line is placed in a selected state to provide a conduction to the switching transistor in the second pixel circuit and a drain current of the driver transistor is outputted to the testing output terminal according to the signal outputted to the data signal line.

A method for testing an image display device of the invention is characterized in that a signal outputted to the data signal line is a video signal.

A method for testing an image display device of the invention is characterized in that a signal outputted to the data signal line is a testing pulse.

An image display device comprises a pixel portion comprising a display region and a testing region, wherein the display region and the testing region comprise a first pixel circuit and a second pixel circuit, respectively. The first pixel circuit comprises a data signal line, a scanning line, a driver transistor provided between a current supply line and a light emitting element, and a switching transistor provided between the data signal line and a gate electrode of the driver transistor. The second pixel circuit comprises the data signal line, the scanning line, and the switching transistor provided between the data signal line and a testing output terminal. A gate electrode of the switching transistor of the first pixel circuit is electrically connected to the scanning line, and the scanning line is placed in a selected state to provide a conduction to the switching transistor in the second pixel circuit and output the signal which is outputted to the data signal line to the testing output terminal.

BRIEF DESCRIPTION OF THE DRAWINGS

FIGS. 5A to 5C are diagrams showing an embodiment of the invention.

DETAILED DESCRIPTION OF THE PREFERRED EMBODIMENTS

The invention is explained in more details in the following embodiment modes.

Embodiment Mode 1

Figure 1A:
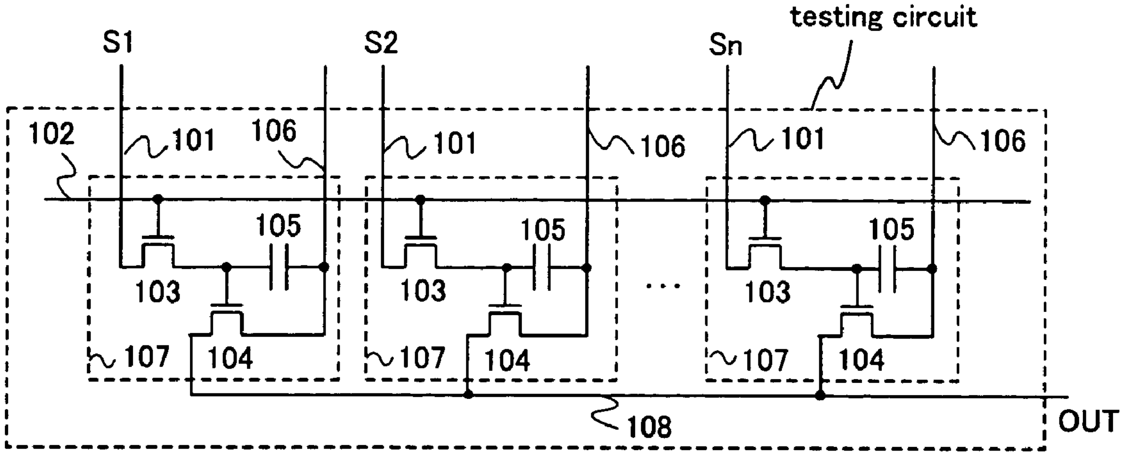
FIGS. 1A and 1B are diagrams showing an embodiment mode of the invention.
Figure 1B:
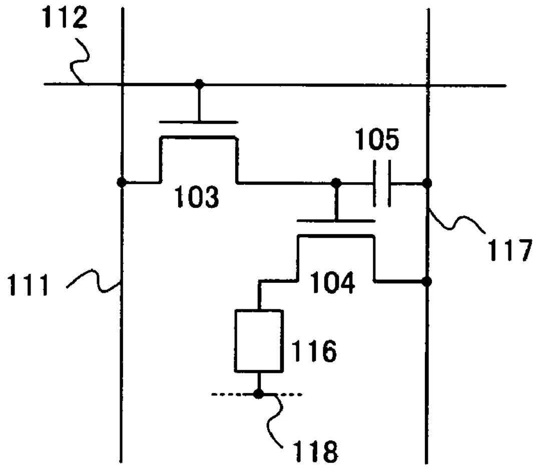

FIG. 1A shows a testing circuit according to the embodiment mode 1 of the invention. The testing circuit comprises a data signal line 101, a scanning line 102, a switching TFT 103, a driver TFT 104, a capacitor 105, a current supply line 106, a testing cell 107, and a testing line 108. The circuit of FIG. 1A is used for testing data signal lines. The testing circuit comprises a pixel circuit as shown in FIG. 1B and the testing cell 107 corresponds to the pixel circuit. The pixel circuit of FIG. 1B comprises a data signal line 111, a scanning line 112, a switching TFT 103, a driver TFT 104, a capacitor 105, an EL element 116, a current supply line 117, and a power source line 118.

In the pixel circuit, the driver TFT 104 supplies a current to the EL element 116 to emit light. The EL element 116 emits light in accordance with a potential of a video signal which is inputted to a gate of the driver TFT 104 from the source signal line 111 through the switching TFT 103.

The configuration of the testing cell 107 is explained by comparison with the pixel circuit of FIG. 1B. First, the EL element 116 to which the driver TFT 104 supplies a current is removed from the pixel circuit. Secondly, the driver TFT 104 is detached from the power source line 118 and connected to the testing line 108 instead. The testing line 108 is connected to a testing terminal. The scanning line 112 shared by pixel circuits is detached from the gate driver circuit so that an independent switch signal line 102 of the testing circuit is obtained. The testing cell 107 is obtained in this manner. The driver TFT 104 operates as an analog switch which is controlled by video signals when a signal is inputted to the switch signal line 102 and the switching TFT 103 is ON.

A method of testing the data signal line is explained hereafter. A testing circuit as shown in FIG. 1A is formed over a substrate. In the testing circuit, n data signal lines which are connected to the pixel portion are connected to S1, S2, . . . , Sn one to one. A potential of the video signal is outputted to each data signal line, and switching signals are inputted at this time. The driver TFT 104 is controlled in accordance with the video signal when the switching TFT 103 is ON, and the test can be carried out by comparing the video signal with the measured output value OUT. By inputting the testing pulse into the video signal, faults can be located easily.

FIG. 5B shows a timing chart at the time of testing. A substrate 501 as shown in FIG. 5A has a configuration that video signals are sequentially supplied to a first latch circuit from a shift register, and outputted simultaneously from a second latch circuit to each data signal line when a latch signal is high. Because of this, n data signal lines S1, S2, . . . , Sn are selected respectively as shown in FIG. 5C to provide n times video signal input periods V. The output signal of this time is a High output as a driver TFT in one testing cell is in the state of ON when a latch signal is selected.

Embodiment Mode 2

Figure 2A:
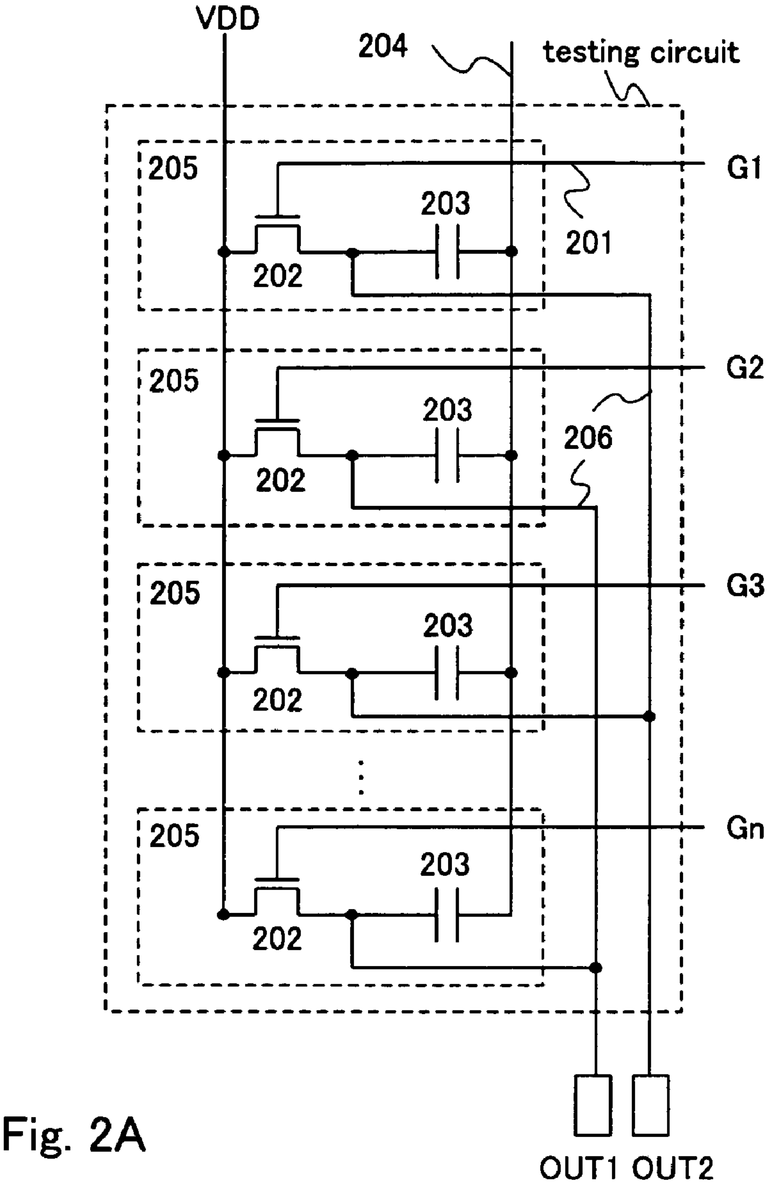
FIGS. 2A and 2B are diagrams showing an embodiment mode of the invention.
Figure 2B:
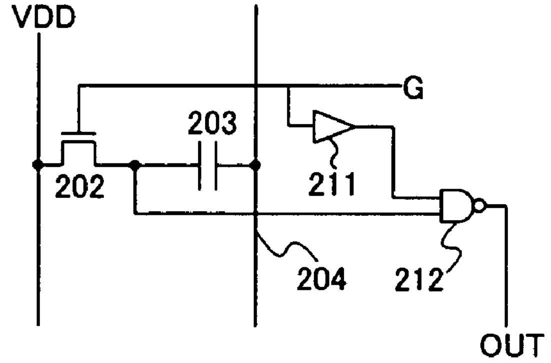
Figure 3:
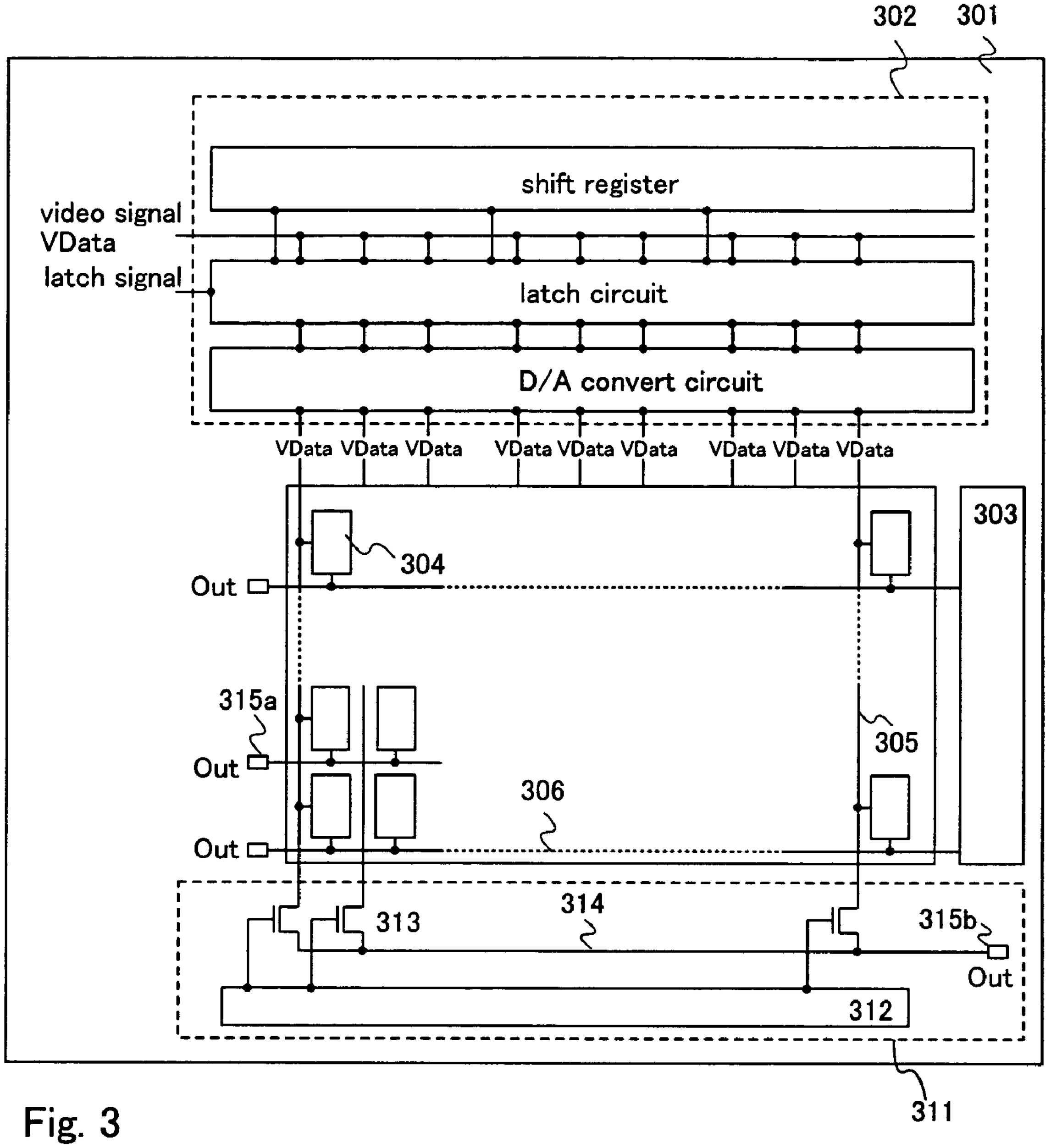
Fig. 3 Prior Art
FIG. 3 is a configuration diagram showing a general image display device and a conventional testing circuit as an example.
Figure 4:
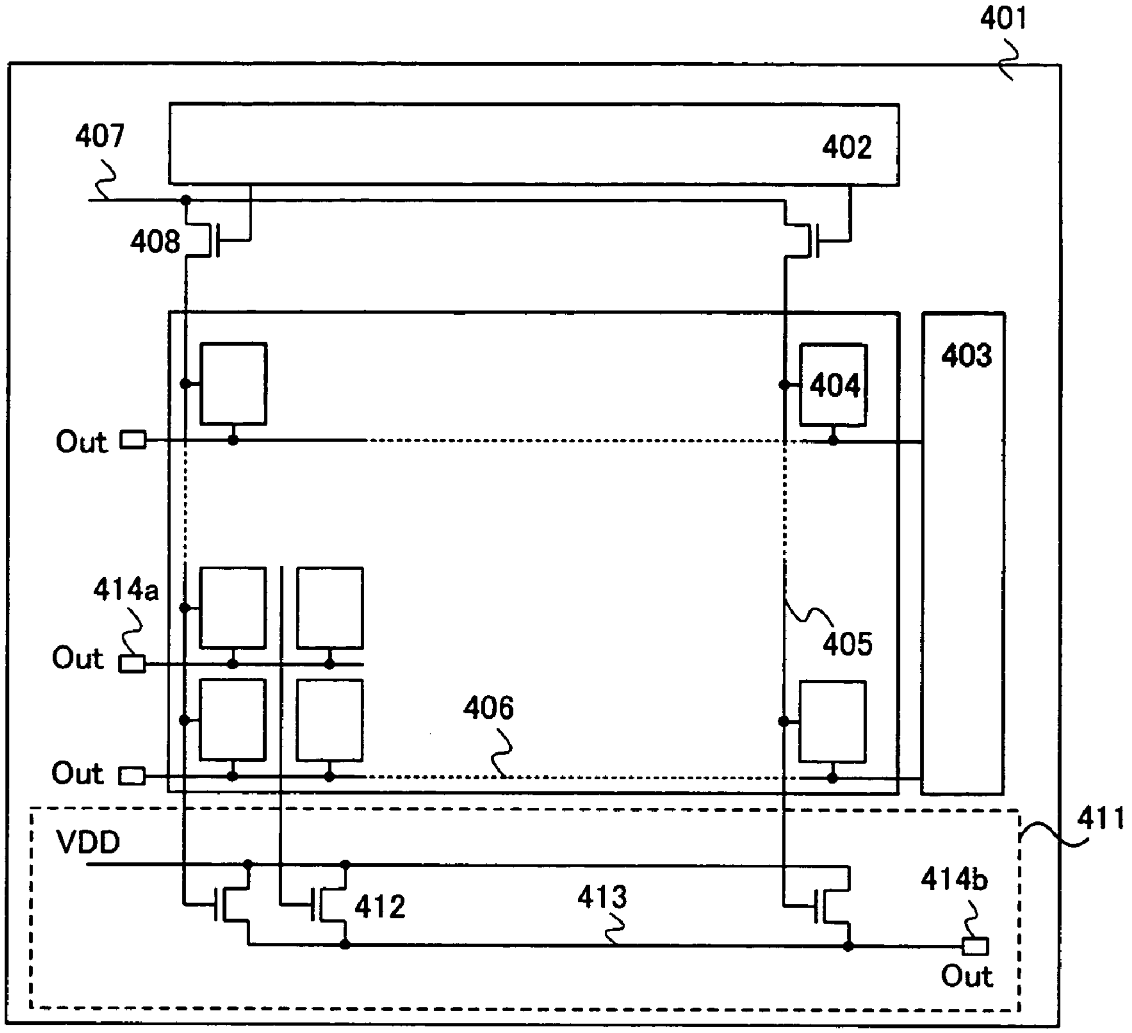
Fig. 4 Prior Art
FIG. 4 is a configuration diagram showing a general testing circuit as an example.

FIGS. 2A and 2B each shows a testing circuit according to the embodiment mode 2 of the invention. This circuit is used for the test of scanning lines. The testing circuit is prepared based on the pixel circuit of FIG. 1B as in embodiment mode 1, and a testing cell 205 in FIG. 2A corresponds to the pixel circuit.

The testing circuit in FIG. 2A comprises a scanning line 201, a switching TFT 202, a capacitor 203, a current supply line 204, a testing cell 205, and a testing line 206.

The configuration of the testing cell 205 is explained by comparison with a pixel circuit. An EL element and a driver TFT are removed from a pixel circuit. The power source line 118 connected to the EL element is detached from the drier TFT 104 and connected to the testing line 206. Also, the data signal line 111 shared by pixel circuits is detached from the source driver circuit and connected to the power voltage VDD, thereby the testing cell 205 is obtained. The switching TFT operates as an analog switch which is controlled by the gate driver circuit.

Driver TFTs do not have to be removed when the pixels need to have the same configurations so the film thickness of EL is homogenous in the display region with dummy pixels in the periphery thereof. In that case, a node of the switching TFT, the driver TFT, and the capacitor is connected to the testing line which is connected to the testing terminal.

A method of testing the scanning signal line is explained hereafter. A testing circuit as shown in FIG. 2A is formed over a substrate. In the testing circuit, n scanning lines which are connected to the pixel portion are connected to G1, G2, . . . , Gn one to one. In accordance with the output from the gate driver circuit to each scanning line 201, the switching TFTs 202 are sequentially turned ON, and test can be conducted by measuring the output value OUT thereof.

The scanning line cannot be inputted a testing pulse unlike the data signal line, and an output portion should be devised. In FIG. 2A, two outputs are provided as OUT1 and OUT2 to which the scanning lines are connected alternately. The shift register selects the switching TFTs 202 sequentially so that a square wave can be detected, which makes the judgment of the test clearer. FIG. 6B shows a timing chart. Each scanning line G1, G2, . . . , Gn is sequentially turned ON and High output is alternately outputted. A merit of outputting such a square wave is that the location of fault can be specified by counting the number thereof.

As a countermeasure against the fact that the testing pulse cannot be inputted, a delay Buffer 211 and a NAND 212 can be added as shown in FIG. 2B so that the Buffer makes the delay and square waves can be detected by the output thereof and NAND calculation.

EMBODIMENT

Embodiments of the invention are explained hereafter.

Embodiment 1

FIG. 5A shows embodiment 1 of the invention. A display device shown here comprises a substrate 501, a source driver circuit 502, a gate driver circuit 503, a pixel 504, a data signal line 505, and a scanning line 506. Among the pixels arranged in matrix, the last row of pixels opposed to the source driver circuit 502 is selected. In the case where dummy pixels are arranged in the periphery of a display region, they may be selected. The selected pixels are changed as follows. The EL element is removed from the pixel and the TFT in the pixel is detached from the power source line which is connected to the EL element, and connected to a testing terminal instead. One testing terminal is employed in the embodiment of FIG. 5A by connecting all the pixels in the row in common, although testing terminals may be plural if needed for the testing reason. Further, the scanning line 506 shared by pixels is detached from the gate driver circuit 503 so that an independent switch signal line is obtained. The switch signal line is independent for simplicity of the test in this embodiment, however, it may remain connected as far as it is controlled by the gate driver circuit. The test of the data signal line is carried out by inputting a testing pulse S1, S2, . . . , Sn in a state that the switch signal line is inputted, and by observing the output signals when latch signals are inputted.

In this embodiment, the TFT in the pixel is used as it is, however, the size of the TFT may be changed analogously in order to increase the sensitivity for confirming the operation of TFT in the pixel.

Embodiment 2

Figure 6A:
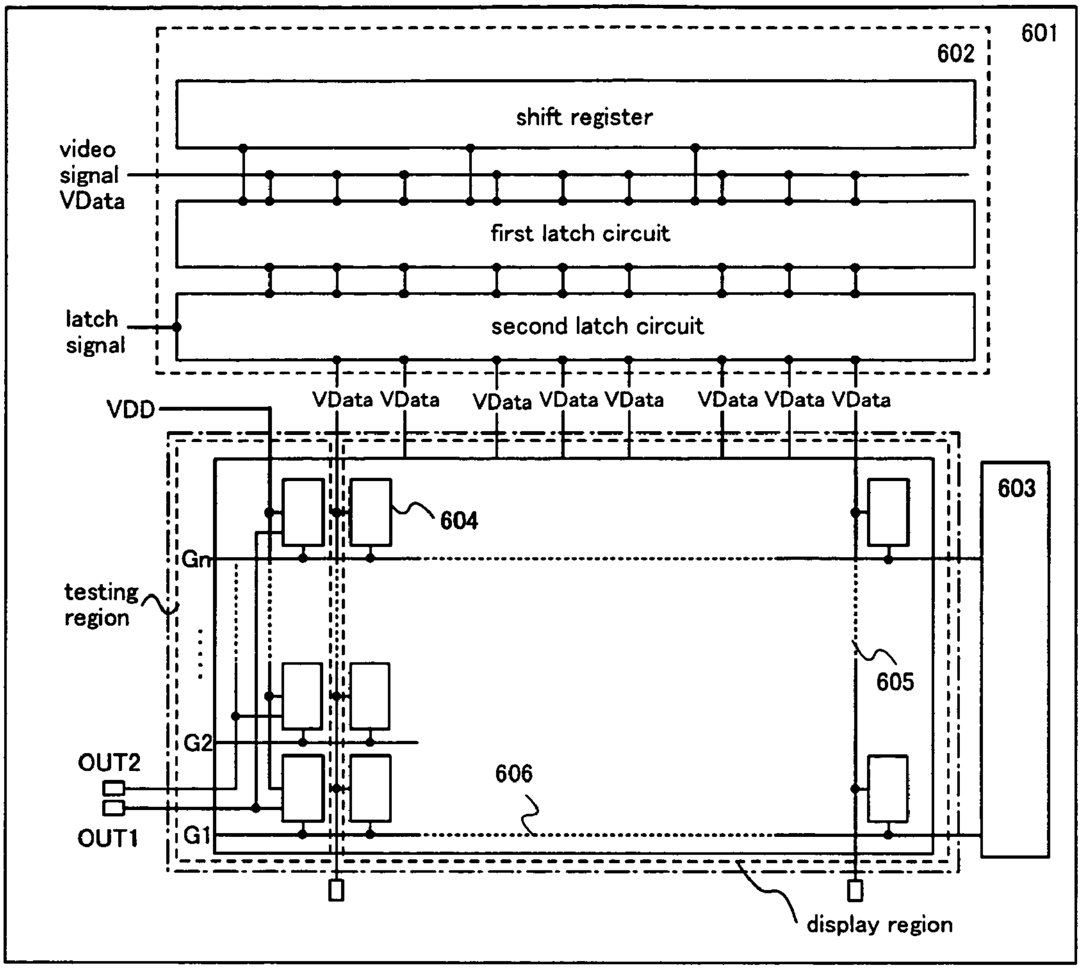
FIGS. 6A and 6B are diagrams showing an embodiment of the invention.
Figure 6B:
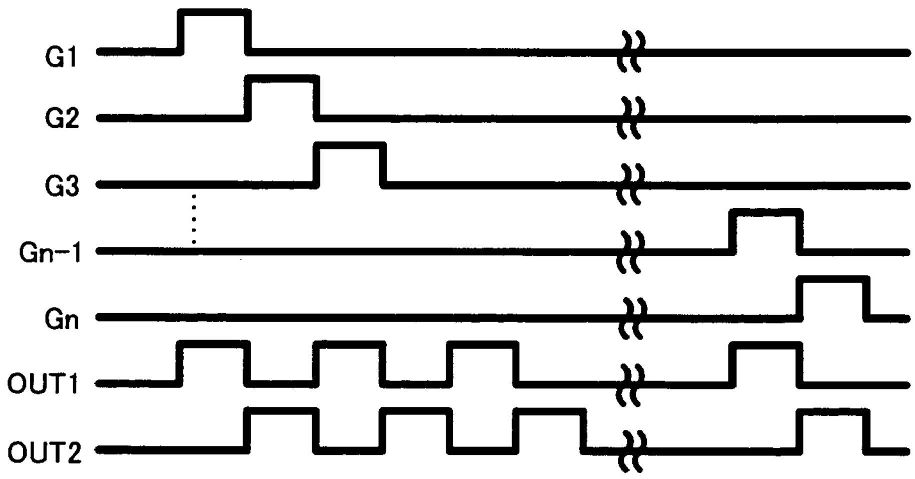
Figure 7A:
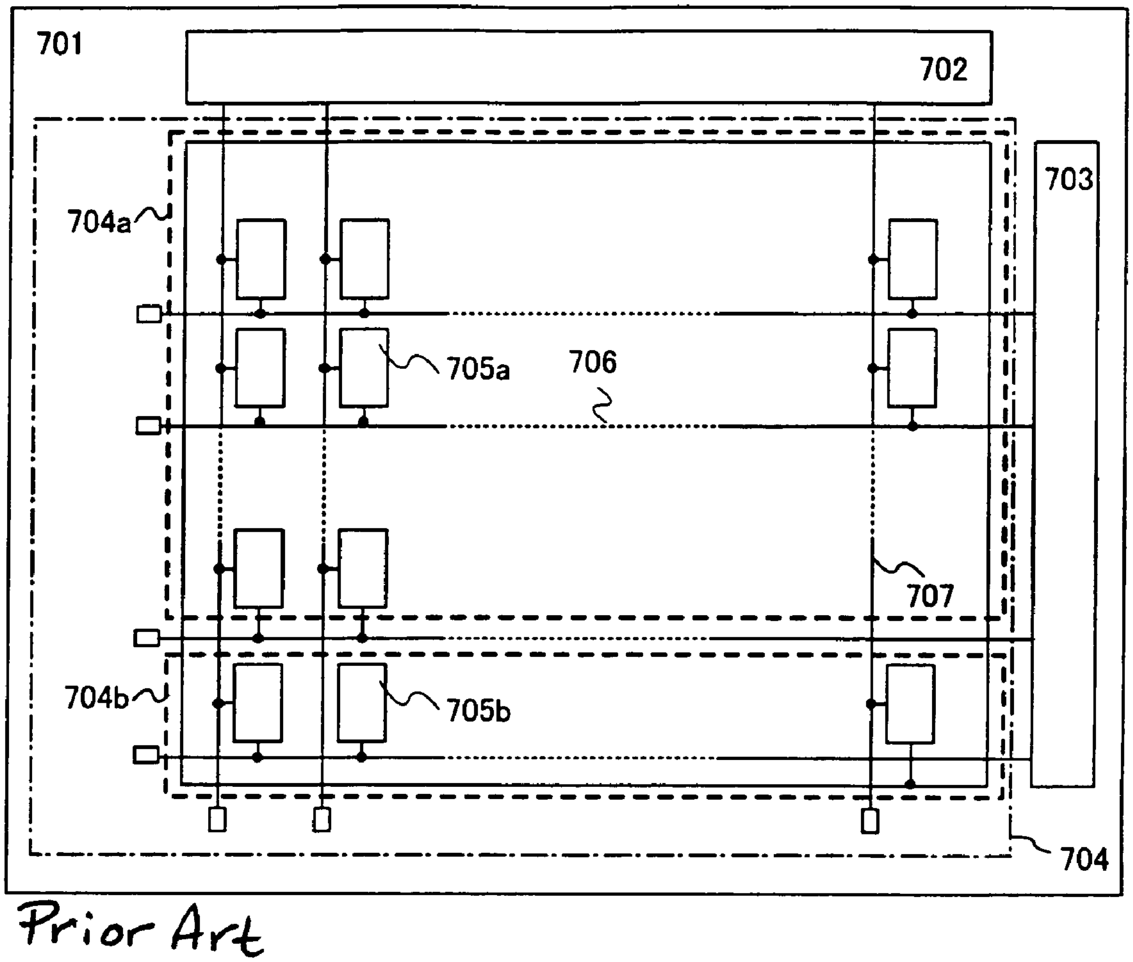
Prior Art Fig. 7A
FIGS. 7A and 7B are configuration diagrams showing a general image display device.
Figure 7B:
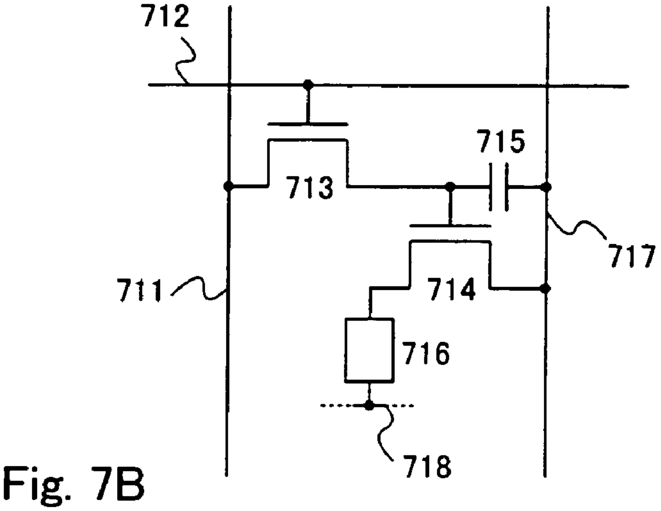
Fig. 7B Prior Art

FIG. 6A shows the second embodiment of the invention. The display device shown here comprises a substrate 601, a source driver circuit 602, a gate driver circuit 603, a pixel 604, a data signal line 605, and a scanning line 606. Among the pixels arranged in matrix, the last row of pixels opposed to the gate driver circuit 603 is selected. In the case where dummy pixels are arranged in the periphery of a display region, they may be selected. The selected pixels are changed as follows. An EL element and a driver TFT are removed from the pixel, and the TFT in the pixel is detached from the power source line connected to the EL element, and connected to a testing line instead. In the embodiment of FIG. 6A, two output terminals are employed to which the scanning line 606 is connected alternately. Further, the data signal line 605 shared by pixels is detached from the source driver circuit 602 and connected to a power voltage instead. The data signal line 605 is connected to the power voltage for the simplicity of the test in this Embodiment, however, they may remain connected as far as a detectable potential level by the source driver circuit 602 is applied. The test of the scanning lines is conducted as shown in FIG. 6B, by operating the gate driver circuit and observing the output signals thereof.

In this embodiment, the TFT in the pixel is used as it is, however, the size of the TFT may be changed analogously in order to increase the sensitivity for confirming the operation of TFT in the pixel.

The invention is made in view to provide an image display device and a testing method which provide a testing circuit by changing a part of a pixel circuit in a display device or using a dummy pixel so that the test for detecting broken wirings and the like of the data signal line and the scanning lines and whether pixels are controlled adequately is easily and accurately conducted, and even the location of faults can be detected if any, while making the space for testing circuit as small as possible.

What is claimed is:

1. An image display device comprising:

a pixel portion comprising a display region and a testing region, wherein the display region and the testing region comprises a first pixel circuit and a second pixel circuit, respectively;

each of the first and second pixel circuits comprising:

a data signal line;

a scanning line;

a driver transistor; and a switching transistor provided between the data signal line and a gate electrode of the driver transistor, wherein a gate electrode of the switching transistor is electrically connected to the scanning line, wherein the driver transistor of the first pixel circuit is provided between a current supply line and a light emitting element, and wherein the driver transistor of the second pixel circuit is provided between the current supply line and a testing terminal.

2. An image display device according to claim 1, wherein the testing region is provided in a dummy pixel region which is provided in an outer edge region of the pixel portion.

3. An image display device comprising:

a pixel portion comprising a display region and a testing region, wherein the display region and the testing region comprises a first pixel circuit and a second pixel circuit, respectively;

the first pixel circuit comprising:

a data signal line;

a scanning line;

a driver transistor provided between a current supply line and a light emitting element; and a switching transistor provided between the data signal line and a gate electrode of the driver transistor; and the second pixel circuit comprising:

the data signal line;

the scanning line; and the switching transistor provided between the data signal line and a testing output terminal, wherein a gate electrode of the switching transistor of the first pixel circuit is electrically connected to the scanning line.

4. An image display device according to claim 3, wherein the testing region is provided in a dummy pixel region which is provided in an outer edge region of the pixel portion.

5. An image display device comprising:

a pixel portion comprising a display region and a testing region, wherein the display region and the testing region comprises a first pixel circuit and a second pixel circuit, respectively;

each of the first and second pixel circuits comprising:

a data signal line;

a scanning line;

a driver transistor; and a switching transistor provided between the data signal line and a gate electrode of the driver transistor, wherein a gate electrode of the switching transistor is electrically connected to the scanning line, wherein the driver transistor of the first pixel circuit is provided between a current supply line and a light emitting element, wherein the driver transistor of the second pixel circuit is provided between the current supply line and a testing terminal, and wherein the scanning line is placed in a selected state to provide a conduction to the switching transistor in the second pixel circuit and a drain current of the driver transistor is outputted to the testing output terminal according to the signal outputted to the data signal line.

6. An image display device according to claim 5, wherein a signal outputted to the data signal line is a video signal.

7. An image display device according to claim 5, wherein a signal outputted to the data signal line is a testing pulse.

8. An image display device comprising:

a pixel portion comprising a display region and a testing region, wherein the display region and the testing region comprises a first pixel circuit and a second pixel circuit, respectively;

the first pixel circuit comprising:

a data signal line;

a scanning line;

a driver transistor provided between a current supply line and a light emitting element; and a switching transistor provided between the data signal line and a gate electrode of the driver transistor;

the second pixel circuit comprising:

the data signal line;

the scanning line; and the switching transistor provided between the data signal line and a testing output terminal, wherein a gate electrode of the switching transistor of the first pixel circuit is electrically connected to the scanning line, and wherein the scanning line is placed in a selected state to provide a conduction to the switching transistor in the second pixel circuit and output the signal which is outputted to the data signal line to the testing output terminal.

* * * * *